United States Patent [19]
Tucker et al.

[11] Patent Number: 6,039,241
[45] Date of Patent: Mar. 21, 2000

[54] MECHANISM FOR REMOVAL OF SURFACE MOUNT CONNECTORS USING HEAT CONDUCTION THROUGH PINS

[75] Inventors: Sean W. Tucker, Loveland; Michael R. Cowan, Fort Collins, both of Colo.; Mark P. Martin, Rocklin, Calif.

[73] Assignee: Hewlett-Packard Company, Palo Alto, Calif.

[21] Appl. No.: 09/062,050

[22] Filed: Apr. 17, 1998

[51] Int. Cl.[7] .............................. B23K 1/018; B23K 5/22; B23K 3/04

[52] U.S. Cl. ........................... 228/264; 228/20.5; 228/51; 228/53; 228/125

[58] Field of Search .................................... 228/119, 125, 228/179.1, 180.1, 180.21, 191, 227, 230, 234.1, 264, 6.2, 15.1, 19, 20.5, 51, 52, 53, 56.2

[56] References Cited

U.S. PATENT DOCUMENTS

| | | | |
|---|---|---|---|
| 4,238,665 | 12/1980 | Tremarco | 219/238 |
| 4,302,276 | 11/1981 | Schulze | 156/553 |
| 4,473,181 | 9/1984 | Grabow, Jr. | 228/51 |
| 4,506,820 | 3/1985 | Brucker | 228/39 |
| 4,518,110 | 5/1985 | Breske et al. | 228/20 |
| 4,637,542 | 1/1987 | Breske et al. | 228/180 |
| 4,723,924 | 2/1988 | Morrison | 439/875 |
| 4,771,932 | 9/1988 | Kim | 228/180.1 |
| 4,979,662 | 12/1990 | Kim | 228/56.1 |
| 5,007,574 | 4/1991 | Carlomagno et al. | 228/20 |
| 5,084,691 | 1/1992 | Lester et al. | 337/297 |
| 5,093,987 | 3/1992 | Scholz | 29/860 |
| 5,147,081 | 9/1992 | Kim | 228/51 |
| 5,152,448 | 10/1992 | Williams | 228/51 |
| 5,174,016 | 12/1992 | Todd | 29/762 |
| 5,240,549 | 8/1993 | Hamburgen et al. | 156/583.91 |
| 5,278,393 | 1/1994 | Kim | 219/228 |
| 5,516,297 | 5/1996 | Atoh et al. | 439/79 |
| 5,549,240 | 8/1996 | Urban | 228/264 |

*Primary Examiner*—Patrick Ryan
*Assistant Examiner*—Kiley Stoner

[57] ABSTRACT

The inventive mechanism conducts heat through the leads of the connector to the solder connection points, and simultaneously reflows all of the solder on all of the pads. The inventive mechanism comprises a machined aluminum piece that mimics the mating geometry for the connector and couples to the connector as if it were a chip device. The inventive mechanism couples to the connector via heat conducting fins. Heat is transferred to the aluminum piece, and down through the fins and into the internal portion of the connector. The fins contact the internal portion of the connector leads. Thus, heat is transferred from the internal portion of the leads to the exterior portion of the leads, and down to the soldered connection point with the PCB board. Since the fins contact all of the internal leads of the connector, each of the soldered connections is reflowed at approximately the same time, and thus, the connector is then removed from the board.

12 Claims, 1 Drawing Sheet

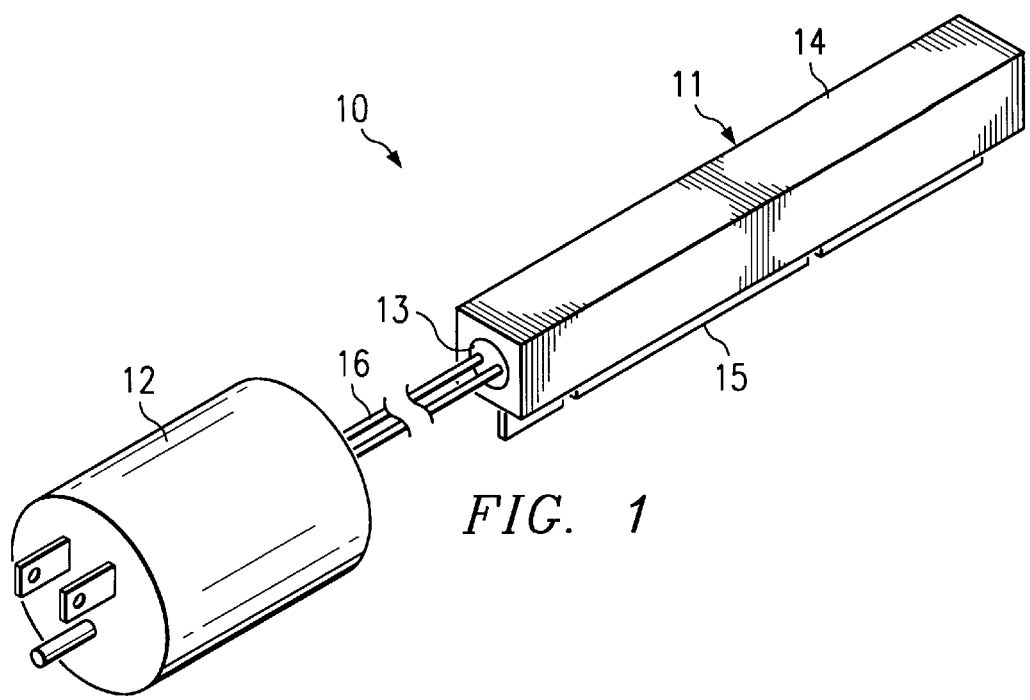
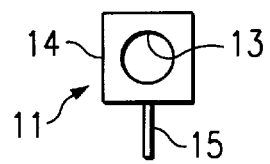
FIG. 2A
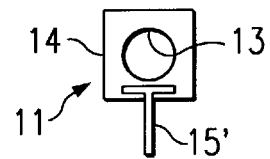
FIG. 2B
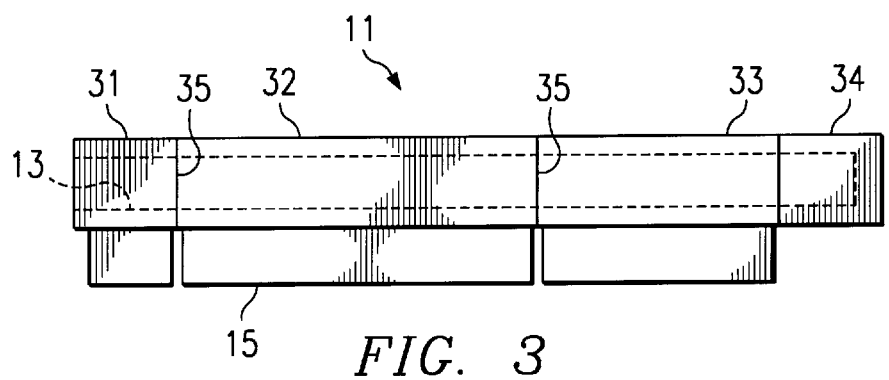
FIG. 3

MECHANISM FOR REMOVAL OF SURFACE MOUNT CONNECTORS USING HEAT CONDUCTION THROUGH PINS

TECHNICAL FIELD OF THE INVENTION

This application relates in general to surface mount connectors for computer chip devices, and in specific to a mechanism which plugs into the connector and passes heat through the connector pins to melt the solder connection between the connector and the computer board.

BACKGROUND OF THE INVENTION

There are two standard methods to connect chip devices to computer boards or PC boards. One method is to directly attach the chip device to the board. However, once attached, it is very difficult to replace the chip device. The second method is to use a connector. The connector would be directly attached to the board, and the chip then inserted into the connector. Thus, the chip device can be easily removed, and a different chip device inserted in its place.

There are two types of connectors, which are identified by their connection mechanism with the board. The first type is a through hole connector. A through hole connector has leads that pass through the board and are soldered to the board from the opposite side of the board. The second type is a surface mount connector. This connector has its leads soldered to the same side of the board upon which it contacts. To facilitate attachment, the leads are "L" or "Z" shaped, with the bottom portion of the "L" or "Z" attached the board. As the boards have become more complex, comprising multiple layers, the surface mount connector has become more popular, since only surface pads are required for connection, and not connection vias which pass completely through the board.

During testing, production, or repair of the boards, it is sometimes necessary to remove the surface mount connectors. For example, the connector may be faulty and need replacing. The prior art uses two mechanisms to remove the connectors. The first mechanism is to use a standard soldering iron. The technician would run the iron along each of the leads of the connector and thus melt or reflow the solder along the leads. If the connector has only a few leads (less than ten or so), the first leads reflowed will stay molten long enough for the last leads to be reflowed. This allows the technician to lift the connector off of the board before any of the solder solidifies.

This mechanism has two main disadvantages. First, since the solder is reflowed lead by lead, the mechanism will only work for connectors having a small number of leads. If the lead count is too high, the solder on the first lead reflowed will solidify before the solder on the last lead can be reflowed, preventing the connector from lifting off the board. This problem often resulted in damage to the board. Specifically, the technician would attempt to pry the connector off of the board without having all of the leads reflowed and thereby damage the board. For example, the surface pads could be ripped off the board. Second, since a solder iron must contact the lead, surrounding components cannot be too close to the connector. This restriction is typically referred to as a keepout restriction. If surrounding components are close to the connector leads, they could be reflowed along with the connector lead (due to the solder iron size). Also, the nearby devices may be damaged from the heat of the iron. This limits board layout possibilities.

The second mechanism is to use a solder pot. The solder pot is a bath or reservoir of molten solder. The technician immerses the connector into the solder pot. The solder pot has been used traditionally with through hole components. Since this type of components have their leads protruding through the back side of the board, technicians could merely lay the board into the pot, reflow the solder at each of the leads and pull the connector off. However, this mechanism does not work well with surface mount connectors, because the solder has to surround the connector without touching other components on top of the board. The technician would have to completely submerge the connector to make contact between the solder in the pot and the solder in the lead connection. Thus, the molten solder reflows the solder at the leads. If the connector is made of metal, then the technician may partially immerse the connector in the molten solder. Thus, the heat of the molten solder is conducted through the metal connector housing to the leads, which will then reflow the solder on the board.

This mechanism also has several disadvantages. If full immersion is used, then a special tool is required to "form" the molten solder. The tool would form the reservoir of the solder into a special shape so that it would only contact the particular connecter being removed. This requires a great deal of additional tooling, since a different tool must be manufactured for each of the components and connectors on the board. Each tool must be specifically made for each connector and component geometry type. Also, full immersion requires the area around the connector leads to be free from any components. This restriction is referred to as a keepout restriction, and also minimizes having the solder contact other components on the board. Partial immersion requires the connector housing to be made out of metal, i.e. the connectors cannot be made from plastic, as plastic will not conduct heat. Also, partial immersion requires a special "forming" tool for the molten solder.

Therefore, there is a need in the art for a mechanism which will reflow the solder on high pin count connectors, without having keepout restrictions, or requiring special form tools for operation.

SUMMARY OF THE INVENTION

These and other objects, features and technical advantages are achieved by a system and method which uses heat conduction through the leads of the connector to the solder connection points. The inventive mechanism simultaneously reflows all of the solder on all of the paths. This allows the connector to be lifted directly off the board. This inventive mechanism comprises a machined aluminum piece that mimics the mating geometry for the connector. In other words, the inventive mechanism couples to the connector as if it were a chip device. The inventive mechanism couples to the connector via heat conducting fins. The mechanism includes a heating cartridge that is press fitted into the mechanism. Thermal grease is placed in between cartridge and the aluminum piece. The inventive mechanism can include a fuse or breaker between the cartridge and the power source for safety considerations.

The inventive mechanism is connected to the power supply, e.g. 120V AC, which heats up the cartridge. Heat is transferred to the aluminum piece, and down through the fins and into the internal portion of the connector. The fins contact the internal portion of the connector leads. Thus, heat is transferred from the internal portion of the leads to the exterior portion of the leads, and down to the soldered connection point with the PCB board. After a period of time, e.g. about five minutes, sufficient heat is transferred to melt the solder, i.e. the fins reach approximately 600° F. Since the fins contact all of the internal leads of the connector, each of the soldered leads is reflowed at approximately the same time, and thus, the connector is then removed from the board.

A technical advantage of the present invention is to allow the removal of high pin count connectors.

Another technical advantage of the present invention is to allow the removal of plastic surface mount connectors.

A further technical advantage of the present invention is to reduce the keepout restrictions imposed on the design layout of the printed circuit board.

A further technical advantage of the present invention is to reduce tooling requirements needed to produce special form tools for the removal of connectors.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 depicts a perspective view of the inventive mechanism;

FIGS. 2A and 2B depict front elevational views of the inventive mechanism; and

FIG. 3 depicts a side elevational view of the inventive mechanism.

DESCRIPTION OF THE PREFERRED EMBODIMENTS

FIG. 1 depicts the inventive mechanism 10, which includes block assembly 11 connected to power supply plug 12, via line 16. The fuse or breaker (not shown) would be connected in line 16, in between assembly 11 and plug 12. Note that the fuse or breaker could be connected directly to assembly 11 or plug 12. Assembly 11 includes aluminum piece 14 and heating cartridge 13. As shown in FIG. 2A, cartridge 13 is located in the approximate center of aluminum piece 14, although cartridge can be located off center or even attached to a side portion of the piece 14, so long as sufficient heat transfer is accomplished. The cartridge is manufactured to be of a particular length and width for fitting with the aluminum piece 14. Cartridge 13 is press fitted into aluminum piece 14. Press fitting involves inserting the cartridge 13 into aluminum piece 14 with the application of force, as the size of the hole in aluminum piece 14 closely matches the size of the cartridge 13. Cartridge 13 is shown to have a round cross-section and aluminum piece 14 is shown to have a square cross-section, however these elements can have any cross-sectional shape. Thermal grease (not shown) is used to aid in the insertion and provide thermal conduction. Cartridge 13 forms an airtight seal with aluminum piece 14, thus permitting good heat transfer from cartridge 13 to aluminum piece 14.

Fins 15 protrude from a lower portion of aluminum piece 14. Fins 15 are specifically formed to fit into a particular connector geometry. As shown in FIG. 1, the geometry is for a 64 bit PCI connector, however, the fins could be fabricated for any geometry. Fins 15 fit into the connector as if they are the leads on a chip device. As shown in FIG. 1, assembly 11 is formed from a single aluminum piece 14 which includes integral fins 15. Alternatively, as shown in FIG. 3, assembly 11 is formed from a plurality of aluminum pieces 31, 32, and 33. Spacers (not shown) would be placed between the pieces at locations 35, as needed, to provide the correct location of the fins for the desired geometry. The spacers could be of any shape, including a round shape similar to a washer. The spacers also could be the same cross-sectional shape of the aluminum pieces 31, 32, 33, in this case square. The spacers would have an appropriately located hole to allow the passage of cartridge 13. The spacers would be press fitted onto the cartridge via thermal grease. The spacers could be made of a conductor or an insulator. The spacers would be pre-formed with a variety of widths so as to provide the correct spacing of the fins. Thus, the correct connector geometry could be replicated by selecting from a plurality of pre-formed aluminum pieces having different sized fins. Note that the width of the fins could be of the same size, as needed to fit the desired geometry. Each piece would be press fitted onto cartridge 13 using thermal grease. If the geometry results in an assembly that is shorter than cartridge 13, an insulating piece 34 could be fitted over the exposed portion of cartridge 13. Thus, the board and other components would not be affected by the heat from the exposed portion of cartridge 13. Therefore, the cartridge does not have to be made to a particular length, but rather could be selected from a stock of various sized cartridges.

Note that fins 15 do not have to be integrally formed with the aluminum piece 14 from a single block of aluminum. As shown in FIG. 2B, fins 15' are removeably attached to aluminum piece 14, via a "T" connection. Other connections could be used so long as good thermal transfer is maintained. Fins 15' would be press fitted into aluminum piece 14 using thermal grease (not shown). Spacers (not shown) would be placed between the fins, as needed, to provide the correct location of the fins. The spacers would have the same "T" shaped connection as fins 15' but would not extend downward, and thus would fit in between fins 15' in piece 14. The spacers could be made of a conductor or an insulator. The spacers would be pre-formed with a variety of widths so as to provide the correct spacing of the fins. Thus, fins having the same or different widths could be inserted into aluminum piece 14 as needed, to form the correct connector geometry for coupling into the connector.

Note that multiple rows of fins could used to fit into connectors that are spaced close together or for connectors that comprise multiple rows of internal leads. Thus, assembly 11 could be made wider (if needed), and accommodate more than one cartridge 13 (if needed) and multiple rows of fins (as needed), to allow for removal of such connectors. Moreover, a series of assemblies 11 could be thermally or electrically linked to form a square, rectangle or polygon shaped mechanism for removing like shaped connectors. Each assembly 11 would comprise a separate aluminum piece, fin array, and cartridge that is either electrically connected to the other cartridges or has its own separate power connection. Alternatively, this mechanism could comprise a single cartridge with the other assemblies thermally coupled to the cartridge. Further note that the inventive mechanism could be coupled to a machine which will remove connectors in a production environment.

The inventive mechanism depicted in the FIGURES would be used as follows. After the correct fin geometry is achieved and the cartridge has been inserted into the aluminum piece, the technician preheats the board and brushes flux on the leads of the connector. The technician then presses the mechanism into the connector, just like a mating device would fit. The technician plugs the cartridge heater into the power source and is heated to about 600° F. Heat is transferred from the heater to the fins of the mechanism, which is then transferred to the pins in the connector. Heat is transferred down the pins in the connector to the leads that are soldered to the board. The solder is reflowed, and the connector lifted off the board. Since the heat is transferred through the leads and not the connector case, the connector can be made of plastic or any other non metal material. However, the inventive mechanism will also work with metal connectors. Note that the mechanism may damage the connector, especially if the connector is plastic. However, the board will not be damaged.

Although the present invention and its advantages have been described in detail, it should be understood that various changes, substitutions and alterations can be made herein without departing from the spirit and scope of the invention as defined by the appended claims.

What is claimed is:

1. An apparatus for removing a soldered device from a board by reflowing at least one soldered connection between the device and the board, the apparatus comprising:

a heater for providing heat; and means for engaging an interior portion of the device;

wherein heat is to be conducted from the heater to the device via the means for engaging which reflows the at least one soldered connection.

2. The apparatus of claim 1, wherein:

the at least one soldered connection comprises a plurality of soldered connections.

3. The apparatus of claim 2, wherein:

the device is designed to receive a chip device; and the means for engaging is to contact the device as if the means for engaging is the chip device.

4. The apparatus of claim 3, wherein:

the plurality of soldered are to be simultaneously reflowed.

5. The apparatus of claim 4, wherein:

the means for engaging includes at least one fin that is thermally coupled to the heater; and the at least one fin is designed to contact a plurality of interior leads of the device as if the at least one fin is the chip device and conduct heat from the heater to the plurality of connections through the plurality of interior leads, thereby simultaneously reflowing the plurality of soldered connections.

6. The apparatus of claim 1, wherein:

the device is a surface mount connector.

7. The apparatus of claim 1, further comprising:

a thermally conductive housing which holds the heater.

8. The apparatus of claim 7, wherein:

the heater is press fitted into the housing via a thermal grease.

9. The apparatus of claim 7, wherein:

the means for engaging is integrally attached to the housing.

10. The apparatus of claim 7, wherein:

the means for engaging is removably attached to the housing via a thermally conductive connection.

11. An apparatus for removing a soldered surface mount connector from a board by simultaneously reflowing a plurality of soldered connections between the connector and the board, wherein the connector is designed to receive a chip device, the apparatus comprising:

a heater for providing heat; and at least one fin that is thermally coupled to the heater, wherein the at least one fin is designed to contact a plurality of interior leads of the connector as if the at least one fin is the chip device and conduct heat from the heater to the plurality of connections through the plurality of interior leads, thereby simultaneously reflowing the plurality of soldered connections.

12. An apparatus for removing a soldered device from a board by reflowing at least one soldered connection between the device and the board, the apparatus comprising:

a heater for providing heat; and at least one fin that is thermally coupled to the heater and is to engage an interior portion of the device;

wherein heat is to be conducted from the heater to the device via the at least one fin and reflow the at least one soldered connection.

* * * * *

UNITED STATES PATENT AND TRADEMARK OFFICE
CERTIFICATE OF CORRECTION

PATENT NO.    : 6,039,241
DATED         : March 21, 2000
INVENTOR(S)   : Sean W. Tucker et al.

It is certified that error appears in the above-identified patent and that said Letters Patent is hereby corrected as shown below:

<u>Column 5,</u>
Line 43, after "soldered" insert -- connections ---

Signed and Sealed this

Twenty-fifth Day of June, 2002

Attest:

Attesting Officer

JAMES E. ROGAN
*Director of the United States Patent and Trademark Office*